United States Patent [19]
Ouchi et al.

[11] Patent Number: 5,330,825
[45] Date of Patent: Jul. 19, 1994

[54] PRINTED CIRCUIT SUBSTRATE WITH PROJECTED ELECTRODE AND CONNECTION METHOD

[75] Inventors: Kazuo Ouchi; Masakazu Sugimoto, both of Osaka, Japan

[73] Assignee: Nitto Denko Corporation, Osaka, Japan

[21] Appl. No.: 21,683

[22] Filed: Feb. 24, 1993

[30] Foreign Application Priority Data
Feb. 24, 1992 [JP] Japan .................................. 4-73453

[51] Int. Cl.$^5$ .............................................. B32B 9/00
[52] U.S. Cl. .................................. 428/209; 428/192; 428/901; 174/250
[58] Field of Search .............. 428/209, 192, 901; 174/250

[56] References Cited

U.S. PATENT DOCUMENTS

| | | | |
|---|---|---|---|
| 3,545,079 | 12/1970 | Kossar | 29/626 |
| 3,747,210 | 7/1973 | Kroll | 29/630 R |
| 4,164,071 | 8/1979 | Kruzich | 29/625 |

FOREIGN PATENT DOCUMENTS

| | | |
|---|---|---|
| 147566 | 7/1985 | European Pat. Off. . |
| 493,103 | 7/1992 | European Pat. Off. . |
| 3740741 | 6/1989 | Fed. Rep. of Germany . |
| 1336575 | 7/1963 | France . |

OTHER PUBLICATIONS

Printed Circuit Handbook 3rd. Edition by Clyde F. Coombs Jr. 1988.

*Primary Examiner*—Patrick J. Ryan
*Assistant Examiner*—Kam F. Lee
*Attorney, Agent, or Firm*—Sughrue, Mion, Zinn, Macpeak & Seas

[57] ABSTRACT

A printed circuit substrate with projected electrode and a connection method using the same are disclosed. The printed circuit substrate comprises an insulating substrate having formed on one surface or both surfaces thereof an electrically conductive circuit, wherein at least one projected electrode comprising a metallic substance is formed at the side of the end portion of the electrically conductive circuit.

3 Claims, 1 Drawing Sheet

PRINTED CIRCUIT SUBSTRATE WITH PROJECTED ELECTRODE AND CONNECTION METHOD

FIELD OF THE INVENTION

The present invention relates to a printed circuit substrate with at least one projected electrode and a connection method using it. More specifically, it relates to a printed circuit substrate with at least one projected electrode capable of attaining thinning when connecting or mounting a semiconductor device, a printer, a recording apparatus, an electric part, an electric circuit part, a production apparatus, an inspection apparatus, etc., by forming an electrode terminal at the side surface of the electrically conductive circuit and to a connection method using the printed circuit substrate.

BACKGROUND OF THE INVENTION

Recently, with the development of a semiconductor industry, thinning, down-sizing, and weight-reduction of electronic instruments proceeds, and it has been desired to mount electric circuit parts at a high density. In particular, various functional parts contained in OA instruments show a tendency of down-sizing. The correspondence to such a down-sizing has been conventionally realized by miniaturizing various parts being mounted on the surface (thickness direction).

However, in such a conventional correspondence, the mounted area can be small-sized but the total thickness of the mounted parts is increased with repeated application of surface mounting. Thus, in the technical field of surface mounting, the development of the technique capable of attaining thinning has been desired.

SUMMARY OF THE INVENTION

The present invention has been made for meeting the above-described demand.

One object of the present invention is to provide a printed circuit substrate with at least one projected electrode capable of being connected in the plane direction.

Another object of the present invention is to provide a mounting method using the printed circuit substrate.

Thus, as a result of various investigations for attaining the above-described objects, the inventors have discovered that a printed circuit substrate which can be connected without increasing the thickness is obtained by forming at least one projected electrode comprising a metallic substance at the side of the end portion of the electrically conductive circuit and have succeeded in accomplishing the present invention.

That is, according to one embodiment of the present invention, there is provided a printed circuit substrate with at least one projected electrode comprising an insulating substrate having an electrically conductive circuit on one surface or both surfaces thereof and, if necessary, further having an dielectric layer on the electrically conductive circuit, wherein at least one projected electrode comprising a metallic substance is formed at the side of the end portion of the electrically conductive circuit.

According to another embodiment of the present invention, there is provided a connection method of the printed circuit substrate with at least one projected electrode, which comprises connecting the printed circuit substrate with the projected electrode to an electrode of a material to be connected with the projected electrode by heating, pressing or heat-pressing.

DETAILED DESCRIPTION OF THE INVENTION

The printed circuit substrate with at least one projected electrode of the present invention and the connecting method thereof are practically described by referring to the accompanying drawings.

Figure 1A:
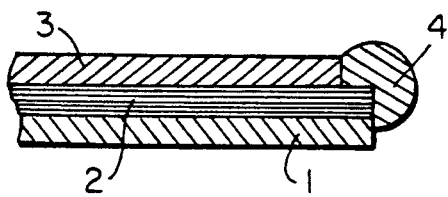
FIG. 1 (*a*), (*b*), and (*c*) are an end portion cross sectional view, an end portion plane view, and an end portion side view, respectively, of one example of the printed circuit substrate with projected electrodes.
Figure 1B:
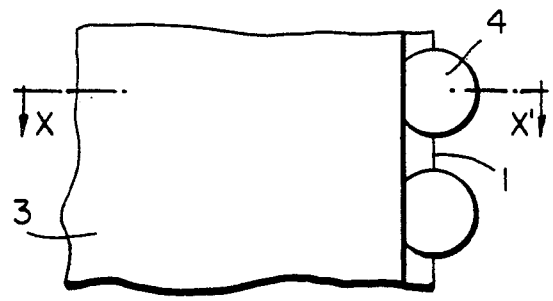
Figure 1C:
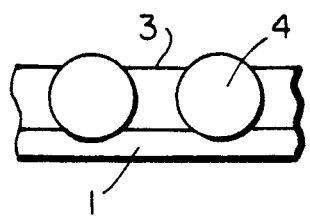

FIG. 1 (*a*) is an end portion cross sectional view (the cross sectional view cut along the line X—X' of FIG. 1 (*b*)) showing one example of the printed circuit substrate with projected electrodes of the present invention, FIG. 1 (*b*) is an end portion plane view of the printed circuit substrate, and FIG. 1 (*c*) is an end portion side view of the printed circuit substrate.

As shown in FIG. 1, the printed circuit substrate 1 with projected electrodes of the present invention comprises an electrically conductive circuit 2 and, if necessary, a dielectric layer 3 laminated thereon, and projected electrodes 4, for connecting to a material to be connected, such as an external element, are formed to the end side of the electrically conductive circuit 2.

As is clear from FIG. 1, since in the present invention the projected electrodes 4, which become the connecting terminals of the electrically conductive circuit 2, are formed at the side of the electrically conductive circuit 2, not at the surface thereof, it is unnecessary to connect to the surface of the electrically conductive circuit as in a conventional case. Further, the printed circuit substrate can be connected to an electrically conductive pattern located in the same plane as the substrate, whereby a substantial increase of the thickness by mounting the conductive circuit pattern can be prevented. Also, the electrically conductive circuit 2 is protected from outside exposer by the dielectric layer 3 and the projected electrodes 4, whereby the reliability of the insulation is improved.

There is no particular restriction on the insulating substrate 1 used in the present invention if the substrate has an electrically insulating property, and a film-form substrate, a board-form substrate, etc., can be used. In these substrates, a substrate having a proper flexibility is preferred from the point of applicability to a mounting portion and, for example, thermosetting resins and thermoplastic resins such as polyester series resins, epoxy series resins, urethane series-resins, polystyrene series resins, polyethylene series resins, polyamide series resins, polyimide series resins, ABS resins, polycarbonate resins, silicone resins, fluorine series resins, etc., can be used.

In these resins, transparent resins are preferred in the point of facilitating positioning in the case of forming the projected electrodes by the step as described below, and the use of a polyimide series resin is also preferred in the points of heat resistance and the mechanical strength. Furthermore, when the resin film is used as the insulating substrate 1, the thickness of the film is from about 5 to 500 μm, and preferably from about 10 to 200 μm from the standpoint of flexibility.

On one surface or both surfaces of the insulating substrate 1 is formed an electrically conductive circuit 2 of a desired form combined with a fundamental pattern composed of copper, nickel, solder, gold, silver, etc., and it is preferred that as occasion demands, a dielectric layer 3 having an optional thickness is laminated on the exposed electrically conductive circuit 2 for the purposes of imparting an electric insulating property and a mechanical strength to the exposed electrically conductive circuit 2 and protecting the electrically conductive circuit 2 from external impurities, foreign matter, moisture, etc.

As the dielectric layer 2, a layer comprising the above-described insulating resin can be used, and a film previously formed from such a resin is laminated or a solution of the resin is coated and dried to laminate the layer.

Figure 2:
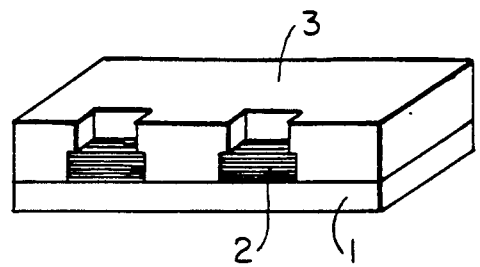
FIG. 2 is an end portion slant view showing a state of the printed circuit substrate before forming the projected electrodes.

FIG. 2 is an end portion slant view showing a state of the printed circuit substrate with projected electrodes shown in FIG. 1 before forming the projected electrodes 4. As shown in FIG. 2, parts of dielectric layer 3 at the end portion of the printed circuit substrate are removed to expose parts of the electrically conductive circuit 2 and projected electrodes 4 can be formed at the exposed portions.

Figure 3:
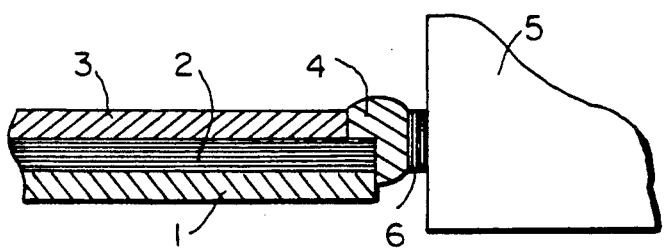
FIG. 3 shows a cross sectional view showing a state of connecting the printed circuit substrate with projected electrodes shown in FIG. 1 to electrode portions of an external element as a material to be connected.

FIG. 3 is a cross sectional view showing a state of connecting the printed circuit substrate with projected electrodes of the present invention shown in FIG. 1 to electrode portions 6 of an external element as a material 5 to be connected. As is clear from FIG. 3, since the printed circuit substrate of the present invention is easily connected to the electrode portions 6 of a material to be connected with the projected electrodes 4 disposed at the side of the substrate by heating, pressing, or heat-pressing, thinning of the system can be attained.

Figure 4:
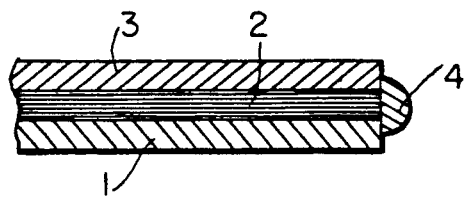
FIG. 4 is an end portion cross sectional view showing another example of the printed circuit substrate with projected electrodes of the present invention.
Figure 5:
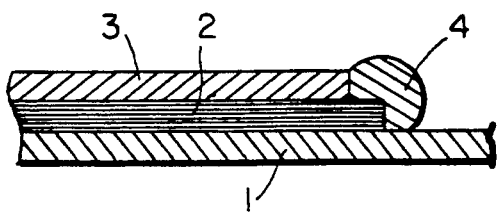
FIG. 5 is an end portion cross sectional view showing a further example of the printed circuit substrate with projected electrodes of the present invention.

FIG. 4 and FIG. 5 each shows an end portion cross sectional view of other examples of the printed circuit substrate with projected electrodes of the present invention. As described above, in the printed circuit substrate shown in FIG. 1, parts of the end portion of the dielectric layer 3 are removed to expose parts of the end portion of the electrically conductive circuit 2, and projected electrodes 4 are formed at the exposed portions. However, in the printed circuit substrate shown in FIG. 4, parts of the dielectric layer 3 are not removed and the projected electrodes 4 are formed at the electrically conductive portion exposed at the side of the end portion of the electrically conductive circuit 2. Accordingly, the projected electrode portions formed are smaller than the projected electrode portions in FIG. 1, whereby the mounted density can be further improved.

Also, the printed circuit substrate with the projected electrode portions shown in FIG. 5 is a modification of the printed circuit substrate with the projected electrode portions shown in FIG. 1 and in the case of FIG. 5, the insulating substrate 1 is largely exposed and projected electrodes 4 are formed at partially exposed portions of the electrically conductive circuit 2.

The printed circuit substrate with projected electrodes of the present invention can be obtained by, for example, the following method.

First, a metallic layer is formed on one surface or both surfaces of an insulating substrate 1 by a vapor deposition or press-adhering. In addition, when the insulating substrate 1 is a film form of a resin, the laminate can be obtained by coating a solution of the resin to form the insulating film on a metallic layer.

Then, a desired circuit pattern is formed by applying a conventional etching method to the metal layer thus laminated to form the electrically conductive circuit 2. Thereafter, if necessary, a dielectric layer 3 is formed on the electrically conductive circuit 2 by a casting method, a press-adhering method, etc. The dielectric layer 3 may be formed such that the projected electrode-forming portions only of the end portion of the electrically conductive circuit, or after forming the dielectric layer 3 on the entire surface of the electrically conductive circuit 2, the projected electrode-forming portions only of the dielectric layer 3 may be removed.

Thereafter, projected electrodes 4 comprising a metallic substance are formed at the exposed end portions of the electrically conductive circuit 2 to provide the printed circuit substrate with projected electrodes of the present invention.

In the production method described above, as a processing method for the dielectric layer 3 and the insulating substrate 1, a mechanical processing method, a laser processing method, a light processing method, a chemical etching method, etc., can be used. In these methods, from the points of the fine processability, the freedom of the processed form, and the like as shown in FIG. 2, a laser processing method by irradiating ultraviolet laser such as excimer laser is preferably employed.

As a method of forming projected electrodes 4, a plating method such as an electrolytic plating method, an electroless plating method, etc., a wire bonding method, a soldering paste potting method, etc., can be employed. Of those, a plating method such as an electrolytic plating method, etc., is preferably used from the points of facilitating the formation of the fine projected electrodes and the processability.

The projected electrodes 4 formed comprise a metal such as gold, silver, copper, nickel, tin, etc., or an alloy comprising the above-described metals as the main components. The size of the projected electrode can be optionally selected according to the size of the electrode portion. Also, the form of the projected electrode is optional, but usually a spherical form is employed.

The projected electrode 4 may be formed by a single metal layer or may have a multilayer structure using plural metals for controlling the properties of the projected electrode such that the electrode is fit to the electrode of a material to be connected. For example, in the case of using the projected electrode for terminals to which a force is repeatedly applied and in the case that it is required for the projected electrode to intrude into the electrode of a material to be connected, it is preferred to form a multilayer structure using a relatively hard metal such as nickel as the core metal of the projected electrode and using a metal for connection such as gold, solder, etc., as the surface metal.

As described above, since the printing circuit substrate with projected electrodes of the present invention has projected electrodes for connection formed at the side of the end portion of the electrically conductive circuit, the printed circuit substrate can be mounted without increasing the thickness after connection and thinning can be easily realized. In particular, the printed circuit substrate with projected electrodes of the present invention can sufficiently meet the down-sizing of various functional parts contained in OA instruments and also can meet the demand for thinning at surface mounting.

While the invention has been described in detail and with reference to specific embodiments thereof, it will be apparent to one skilled in the art that various changes and modifications can be made therein without departing from the spirit and scope thereof.

What is claimed is:

1. A printed circuit substrate with at least one projected electrode comprising an insulating substrate having formed on one surface or both surfaces thereof an electrically conductive circuit, wherein at least one projected electrode comprising a metallic substance is formed at the side of the end portion of the electrically conductive circuit.

2. A printed circuit substrate as claimed in claim 1, wherein the insulating substrate has a dielectric layer laminated on the electrically conductive circuit.

3. A printed circuit substrate as claimed in claim 1, wherein said insulating substrate is a resin film.

* * * * *